United States Patent
Oi et al.

(10) Patent No.: US 9,048,331 B2
(45) Date of Patent: Jun. 2, 2015

(54) METHOD OF MANUFACTURING SEMICONDUCTOR DEVICE

(71) Applicant: Shinko Electric Industries Co., Ltd., Nagano-ken (JP)

(72) Inventors: Kiyoshi Oi, Nagano (JP); Yoshihiro Machida, Nagano (JP); Hiroyuki Saito, Nagano (JP); Yohei Igarashi, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 56 days.

(21) Appl. No.: 14/108,117

(22) Filed: Dec. 16, 2013

(65) Prior Publication Data

US 2014/0170810 A1    Jun. 19, 2014

(30) Foreign Application Priority Data

Dec. 18, 2012 (JP) .................................. 2012-275832

(51) Int. Cl.
| | |
|---|---|
| *H01L 21/00* | (2006.01) |
| *H01L 23/00* | (2006.01) |
| *H01L 23/498* | (2006.01) |
| *H01L 21/56* | (2006.01) |

(52) U.S. Cl.
CPC .............. *H01L 24/81* (2013.01); *H01L 24/27* (2013.01); *H01L 24/97* (2013.01); *H01L 2224/16225* (2013.01); *H01L 2224/32225* (2013.01); *H01L 2224/73204* (2013.01); *H01L 2224/83192* (2013.01); *H01L 24/13* (2013.01); *H01L 24/83* (2013.01); *H01L 24/92* (2013.01); *H01L 2224/13111* (2013.01); *H01L 2224/13116* (2013.01); *H01L 2224/13144* (2013.01); *H01L 2224/27001* (2013.01); *H01L 2224/27013* (2013.01); *H01L 2224/81815* (2013.01); *H01L 2224/83101* (2013.01); *H01L 2224/83862* (2013.01); *H01L 2924/20105* (2013.01); *H01L 2924/20107* (2013.01); *H01L 23/498* (2013.01); *H01L 23/49827* (2013.01); *H01L 21/561* (2013.01); *H01L 21/563* (2013.01)

(58) Field of Classification Search
None
See application file for complete search history.

(56) References Cited

U.S. PATENT DOCUMENTS

2005/0287708 A1* 12/2005 Kim et al. ...................... 438/118

FOREIGN PATENT DOCUMENTS

| JP | 2010-251346 | * | 4/2010 | ............. H01L 21/60 |
|---|---|---|---|---|
| JP | 2010-251346 A | | 11/2010 | |
| JP | 2013-157435 A | | 8/2013 | |

* cited by examiner

*Primary Examiner* — Seahvosh Nikmanesh
*Assistant Examiner* — Brigitte Paterson
(74) *Attorney, Agent, or Firm* — Wolf, Greenfield & Sacks, P.C.

(57) ABSTRACT

A method of manufacturing a semiconductor chip includes forming a masking member including an opening on a wiring substrate including a chip mounting region so as to align the opening with the chip mounting region, forming an uncured sealing resin on at least the chip mounting region of the wiring substrate, wherein a support film is formed on the uncured sealing resin, removing the support film from the uncured sealing resin, removing the masking member from the wiring substrate so that the uncured sealing resin remains on the chip mounting region, and flip-chip mounting a semiconductor chip onto the chip mounting region with the uncured sealing resin arranged in between. The uncured sealing resin has a higher temperature when removing the masking member than when removing the support film.

10 Claims, 16 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2012-275832, filed on Dec. 18, 2012, the entire contents of which are incorporated herein by reference.

FIELD

The present disclosure relates to a method of manufacturing a semiconductor device.

BACKGROUND

A known semiconductor device includes a wiring substrate and a semiconductor chip that is flip-chip mounted on the wiring substrate. A method of manufacturing such a semiconductor device includes flip-chip mounting the semiconductor chip on the wiring substrate, and then applying a resin to the surrounding of the semiconductor chip to fill the gap between the semiconductor chip and the wiring substrate by the resin using capillary action.

Japanese Laid-Open Patent Publication No. 2010-251346 describes a pre-sealing technique that forms an uncured sealing resin in advance on a wiring substrate before mounting a semiconductor chip and thereafter forcing connection bumps of the semiconductor chip into the sealing resin. This seals the gap between the semiconductor chip and the wiring substrate at the same time as when flip-chip mounting the semiconductor chip onto the wiring substrate.

SUMMARY

A referential example of method of manufacturing a semiconductor device using the pre-sealing technique will now be described. First, as illustrated in FIG. 17A, a wiring substrate 90 is prepared. The wiring substrate 90 includes a substrate main body 91, a wiring pattern 92, and a solder resist layer 93. The wiring pattern 92 and the solder resist layer 93 are formed on chip mounting regions A1 in an upper surface of the substrate main body 91. The wiring patterns 92 are exposed from openings 93X of the solder resist layer 93.

Next, as illustrated in FIG. 17B, a masking tape 94 having openings 94X corresponding to the chip mounting regions A1 is applied to the solder resist layer 93.

As illustrated in FIG. 17C, a transfer jig 95 is tentatively adhered to the masking tape 94. The transfer jig 95 includes openings 95X that are larger than the openings 94X of the masking tape 94. Sealing resin materials 96 are prepared. Each resin material 96, which includes an uncured resin film 96A and a support film 96B formed on the resin film 96A, has a size substantially conforming to the chip mounting region A1. The sealing resin material 96 is arranged on the transfer jig 95 and the wiring substrate 90. Then, the transfer jig 95 is vibrated so that each sealing resin material 96 enters the corresponding opening 95X of the transfer jig 95.

Then, as illustrated in FIG. 17D, each sealing resin material 96 is thermocompressed and bonded to the wiring substrate 90. The resin film 96A of each thermocompression-bonded sealing resin material 96 forms an uncured sealing resin 96C that covers the wiring pattern 92 and the substrate main body 91 formed in the corresponding chip mounting region A1. Subsequently, as illustrated in FIG. 18A, the masking tape 94 is removed from the wiring substrate 90. Portions of the sealing resin 96C formed on the masking tape 94 are torn and removed from the wiring substrate 90 together with the masking tape 94.

Then, as illustrated in FIGS. 18B and 18C, connection bump 98 of semiconductor chips 97 are pressed into the sealing resin 96C and joined with the wiring patterns 92 of the wiring substrate 90. Subsequently, the sealing resin 96C is cured. This manufactures a semiconductor device in which the semiconductor chips 97 are flip-chip mounted on the wiring substrate 90, and the sealing resin 96C is filled between the semiconductor chips 97 and the wiring substrate 90.

The inventors of the present application have noticed that when the masking tape 94 is removed from the wiring substrate 90 in the manufacturing method of the referential example, the sealing resin 96C remaining in the chip mounting regions A1 may be damaged. For example, when removing the masking tape 94 under room temperature, due to the brittleness of the sealing resin 96C, cracks may form in the torn surface of the sealing resin 96C. When removing the masking tape 94 while heating the sealing resin 96C, the adhesion increases between the sealing resin 96C and the support film 96B. Thus, portions of the sealing resin 96C that should remain in the chip mounting regions A1 may entirely or partially removed together with the masking tape 94 applied to the support film 96B.

One aspect of the present disclosure is a method of manufacturing a semiconductor device. The method includes forming a masking member including an opening on a wiring substrate including a chip mounting region so as to align the opening with the chip mounting region, forming an uncured sealing resin on at least the chip mounting region of the wiring substrate, wherein a support film is formed on the uncured sealing resin, removing the support film from the uncured sealing resin, removing the masking member from the wiring substrate so that the uncured sealing resin remains on the chip mounting region, and flip-chip mounting a semiconductor chip onto the chip mounting region with the uncured sealing resin arranged in between. The uncured sealing resin has a higher temperature when removing the masking member than when removing the support film.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

Figure 1A:
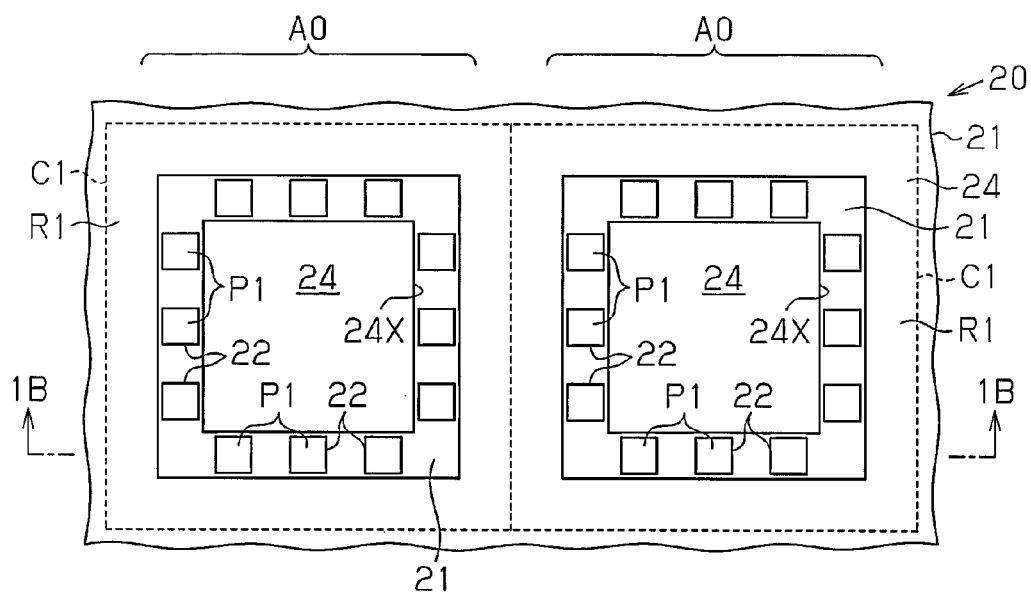
FIG. 1A is a plan view and FIG. 1B is a cross-sectional view illustrating a method of manufacturing a semiconductor device of a first embodiment.

Embodiments will now be described with reference to the drawings. In the drawings, elements are illustrated for simplicity and clarity and have not necessarily been drawn to scale. To facilitate understanding, hatching lines may not be illustrated in the cross-sectional drawings.

A method of manufacturing a semiconductor device according to a first embodiment will now be described with reference to FIGS. 1 to 8.

Figure 1B:
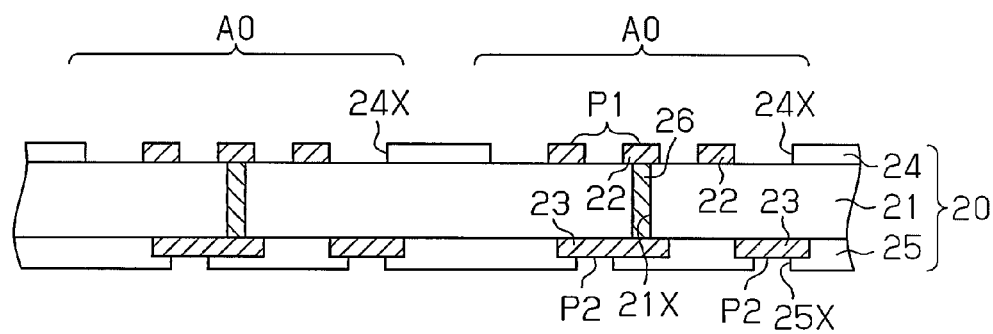
Figure 8:
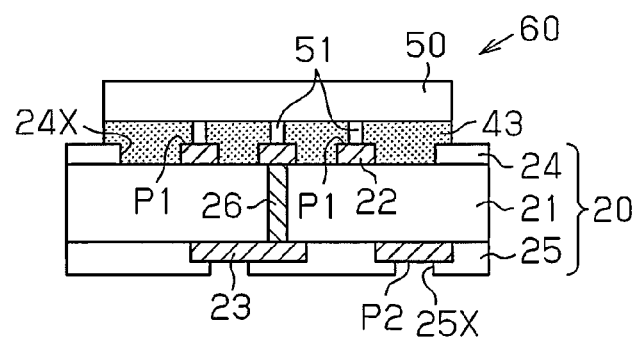
FIG. 8 is a cross-sectional view illustrating the manufacturing method of the first embodiment.

The first embodiment is directed to a method of manufacturing a semiconductor device 60 illustrated in FIG. 8 that includes a wiring substrate 20, semiconductor chips 50, and a sealing resin 43. First, the wiring substrate 20 illustrated in FIGS. 1A and 1B is prepared. In the illustrated example, the wiring substrate 20 is a batch substrate including a plurality of regions R1. Each region R1 functions as a structure that forms the semiconductor device 60 in cooperation with the semiconductor chip 50, which is mounted in a step that will be described later. A semiconductor chip 50 is mounted in each region R1 of the wiring substrate 20 illustrated in FIG. 1. Then, the wiring substrate 20 is cut along a cutting line C1 with a dicing blade or the like. This manufactures a plurality of individualized semiconductor devices 60. Each region R1 includes a plurality of chip mounting regions A0 in which semiconductor chips 50 are flip-chip mounted.

As illustrated in FIG. 1B, the wiring substrate 20 includes a substrate main body 21, an uppermost layer wiring pattern 22, a lowermost layer wiring pattern 23, and solder resist layers 24 and 25. The structure of the substrate main body 21 is not particularly limited but preferably has an outermost layer, which includes the wiring patterns 22 and 23, and a substrate internal structure, which electrically connects the wiring patterns 22 and 23 like through electrodes 26. For example, the substrate main body 21 may or may not include an internal wiring layer. In the illustrated example, the substrate main body 21 includes an insulating substrate made of glass epoxy resin or the like, through holes 21X extending through the insulating substrate in the thicknesswise direction, and the through electrodes 26 filled in the through holes 21X to electrically connect the wiring patterns 22 and 23. The substrate main body 21 in a further embodiment may include a through hole plated layer (through electrode), which is arranged on an inner wall of each through hole 21X to electrically connect the wiring patterns 22 and 23, and a resin plug, which fills the hole defined by the through hole plated layer.

The material of the wiring patterns 22 and 23 and the through electrode 26 may be a conductor such as copper or copper alloy, for example.

The solder resist layer 24, which includes opening 24X exposing the wiring pattern 22, is formed on the upper surface of the substrate main body 21. As illustrated in FIG. 1A, the opening 24X of the solder resist layer 24 may be shaped to extend along the periphery of the corresponding region R1. Wiring patterns 22 are arranged in a peripheral arrangement in the opening 24X. The upper surface of each wiring pattern 22 exposed from the opening 24X functions as a connection pad P1. In some embodiments, a solder layer and a metal layer are formed on the surface of the wiring pattern 22. Examples of the metal layer includes a gold (Au) layer, a lamination of a nickel (Ni) layer and an Au layer (metal layer in which an Ni layer and an Au layer are stacked in this order on the wiring pattern 22), and a lamination of an Ni layer, a palladium (Pd) layer, and an Au layer (metal layer in which Ni layer, Pd layer, and Au layer are stacked in this order).

In some embodiments, the wiring patterns 22 (connection pads P1) are arranged in a lattice over the entire chip mounting region A0. In another embodiment, the solder resist layer 24 and the wiring patterns 22 may be arranged so that the solder resist layer 24 has an opening over each wiring pattern 22.

As illustrated in FIG. 1B, the solder resist layer 25, which includes openings 25X exposing portions of the wiring patterns 23, is formed on a lower surface of the substrate main body 21. Portions of the wiring patterns 23 exposed from the opening 25X function as external connection pads P2. The external connection pads P2 are connected to external connection terminals such as solder balls, lead pins, and the like to mount the wiring substrate 20 on a mounting substrate such as a motherboard or the like. In some embodiments, an OSP (organic solderbility preservative) process is performed on the wiring patterns 23 exposed from the openings 25X to form an OSP film, and the external connection terminals are connected to the OSP film. In another embodiment, a metal layer is formed on the wiring patterns 23 exposed from the openings 25X, and the external connection terminal and the like are connected to the metal layer. Examples of the metal layer includes, for example, an Au layer, a lamination of an Ni layer and an Au layer (metal layer in which Ni layer and Au layer are stacked in this order on the wiring pattern 23), a lamination of an Ni layer, a Pd layer, and an Au layer (metal layer in which Ni layer, Pd layer, and Au layer are stacked in this order on the wiring pattern 23). In some embodiments, the wiring pattern 23 (or the OSP film or the metal layer if the OSP film or the metal layer is formed on the wiring pattern 23) itself exposed from the opening 25X functions as the external connection terminal.

In some embodiments, the surface of the wiring substrate 20 at least to where a sealing resin 43 (see FIG. 3) is applied in a subsequent step is roughened at the point of time illustrated in FIG. 1. In the illustrated example, the substrate main body 21 includes a roughened upper surface, and the solder resist layer 24 includes roughened surfaces (upper and side surfaces) to improve the wetness with respect to the sealing resin 43. The surface roughening may be performed through, for example, a plasma process or a desmear process. The plasma process uses, for example, argon gas as the reaction gas, and supplies approximately 500 W of power.

Figure 2A:
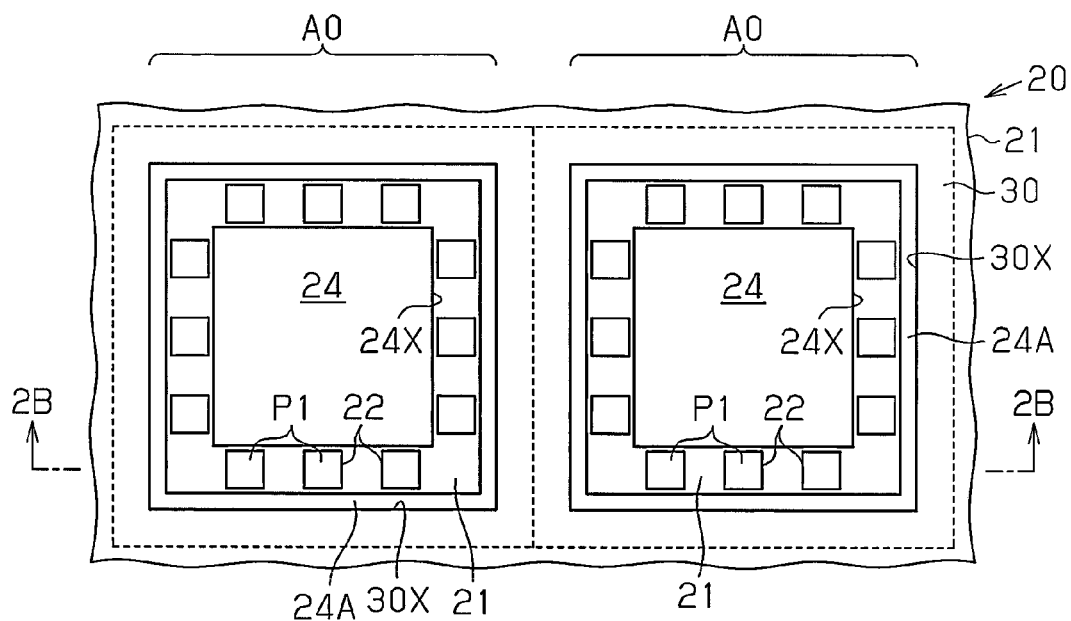
FIG. 2A is a plan view and FIG. 2B is a cross-sectional view illustrating the manufacturing method of the first embodiment.
Figure 2B:
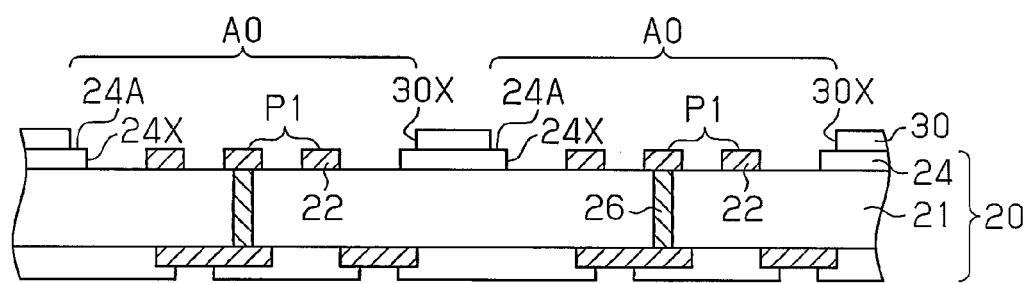

Next, a masking tape 30 (masking member) is applied to the solder resist layer 24, as illustrated in FIGS. 2A and 2B. The masking tape 30 includes an opening 30X for each chip mounting region A0 of the substrate main body 21. The opening 30X is larger than the corresponding opening 24X of the solder resist layer 24. Thus, in each chip mounting region A, portions of the solder resist layer 24 projects into the opening 30X of the masking tape 30 and forms a projection 24A, or step, extending along the periphery of the corresponding region R.

The openings 30X are formed by, for example, punching out the masking tape 30 with a die before the masking tape 30 is applied to the solder resist layer 24. The masking tape 30 including the openings 30X is then applied to the solder resist layer 24. The masking tape 30 may be applied with, for example, an applying device (not illustrated). For example, the applying device may align the chip mounting regions A0 of the wiring substrate 20 and the opening 30X by detecting positioning marks (not illustrated) on the wiring substrate 20 when applying the masking tape 30 to the solder resist layer 24. The use of the applying device allows for the application of the masking tape 30 with a high positioning accuracy of approximately ±0.2 mm. The masking tape 30 including the lattice of the openings 30X is applied to the solder resist layer 24 (wiring substrate 20). In this step, the openings 30X of the masking tape 30 are arranged on the chip mounting regions A0 with high accuracy. Thus, the sealing resin filled in each opening 30X of the masking tape 30 does not excessively extend out from the semiconductor chips in subsequent steps.

The thickness of the masking tape 30 is, for example, from 20 to 50 µm. The material of the masking tape 30 is, for example, vinyl chloride or a PET film. In some embodiments, the masking tape 30 has a lower surface including an adhesive (not illustrated) of acryl resin and the like. The masking tape 30 including the adhesive is tentatively applied to the solder resist layer 24 so that it can be easily removed from the solder resist layer 24 in a subsequent step.

In some embodiments, the openings 30X may be formed through laser processing. For example, the masking tape 30, which does not include the openings 30X, may be applied to the entire upper surface of the substrate main body 21. Then, the masking tape 30 may be laser-cut so as to trace the profiles of the openings 30X. Then, the laser-traced portions may be removed from the masking tape 30 to form the openings 30X.

Figure 3A:
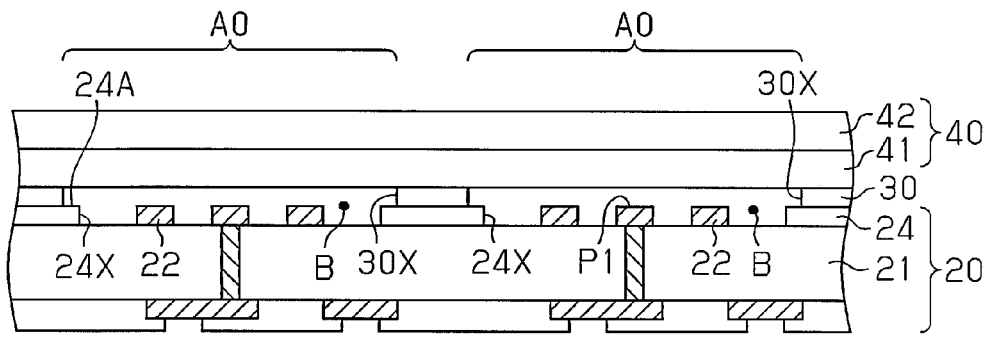
FIGS. 3A to 3C are cross-sectional views for describing the manufacturing method illustrating the manufacturing method of the first embodiment.

Next, as illustrated in FIG. 3A, a sealing resin material 40 that covers the entire upper surface of the wiring substrate 20 is arranged on the masking tape 30. The same sealing resin material 40 may be used to cover the chip mounting regions A0.

The sealing resin material 40 may be a laminated film of a resin film 41 and a support film 42 formed on the resin film 41. The material of the resin film 41 is an insulating resin in a semi-cured state (B-stage state). The insulating resin may be, for example, a thermosetting resin such as an epoxy resin or a polyimide resin. Preferably, the resin film 41 is adhesive and may be an insulating resin sheet in a B-stage state such as a non-conductive film (NCF). The support film 42 functions as a backing or a support that reinforces or supports the semi-cured, or uncured, resin film 41. In a preferred embodiment, the support film 42 has a lower surface that undergoes a mold release process so that the support film 42 may easily be removed from the resin film 41.

The thickness of the resin film 41 is, for example, from 20 to 50 µm. The thickness of the support film 42 is, for example, from 50 to 100 µm.

At the point of time when the sealing resin material 40 is arranged on the masking tape 30, a cavity B is defined at the lower side of the sealing resin material 40 by the sealing resin material 40, the masking tape 30, the solder resist layer 24, and the substrate main body 21.

Figure 3B:
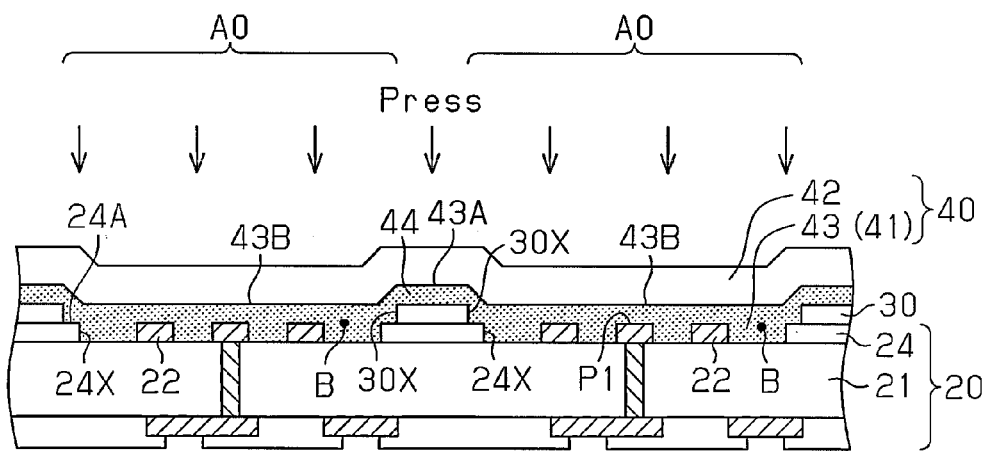

Next, as illustrated in FIG. 3B, the sealing resin material 40 is pressed toward the lower side with a pressing member (not illustrated) while heating the structural body including the cavity B illustrated in FIG. 3A to thermocompress and bond the resin film 41 to the wiring substrate 20. The resin film 41, softened or melted by the heat, is applied to the wiring substrate 20. At the same time, the resin film 41 is pressed and filled into the cavity B (FIG. 3B). The heating temperature is, for example, between 60° C. and 100° C. The sealing resin 43 includes a first resin portion that covers each chip mounting region A0 and a second resin portion that covers the masking tape 30. In the illustrated example, the sealing resin 43 continuously extends over the chip mounting regions A0 separated by the masking tape 30. The sealing resin 43 covers the upper surface of the substrate main body 21, the upper and side surfaces of the wiring pattern 22, the upper and side surfaces of the projections 24A, and the upper and side surfaces of the masking tape 30. Portions of the sealing resin 43 covering the solder resist layer 24 and the masking tape 30 form ridges 44. An upper surface 43A of the sealing resin 43 (ridges 44) on the solder resist layer 24 and the masking tape 30 is higher than an upper surface 43B of the sealing resin 43 corresponding to the opening 24X. Each ridge 44 may be a trapezoidal projection having an inclined side surfaces. The width of the ridge 44 becomes decreases toward the upper surface 43A. The sealing resin 43 is pressed toward the lower side when formed. Thus, the upper surfaces 43A and 43B of the sealing resin 43 are flat. The support film 42 is deformed in correspondence with the shape of the upper surface of the sealing resin 43 when undergoing thermocompression bonding and continuously extends over the chip mounting regions A0.

In some embodiments, the thermocompression bonding may be performed by heating and pressurizing the sealing resin material 40 (uncured resin film 41) using a diaphragm (not illustrated) a diaphragm type laminating device in a vacuum atmosphere. Thermocompression bonding is performed under conditions in which the vacuum degree in a chamber for processing the structural body of FIG. 3A is 100 MPa, the pressure at which the diaphragm presses the sealing resin material 40 is 0.3 MPa, and the heating temperature of the sealing resin material 40 is 100° C. The diaphragm is like a rubber balloon and is inflated by, for example, air. The diaphragm may apply the desired pressure to each portion of the sealing resin material 40 that comes into contact with the diaphragm by adjusting the pressure, heating temperature, and the like. The material of the diaphragm may be, for example, silicone rubber.

Figure 3C:
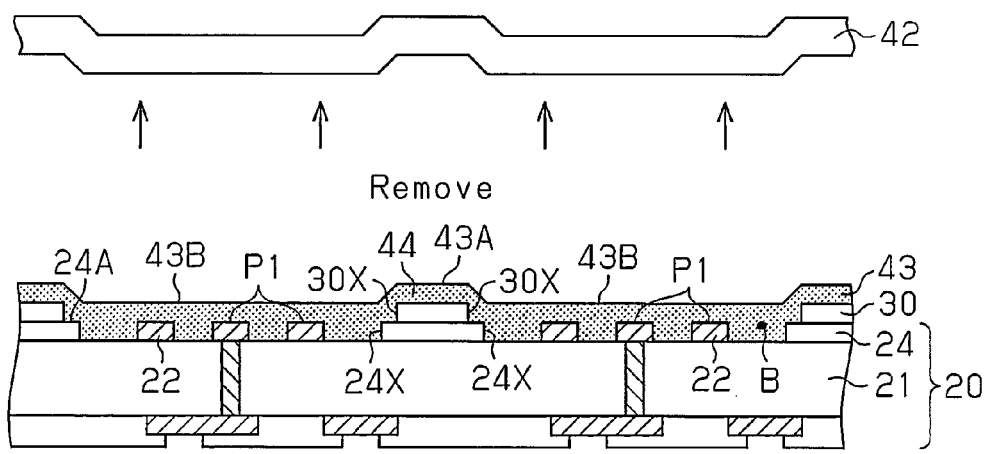

As illustrated in FIG. 3C, the support film 42 is removed from the sealing resin 43 under room temperature (e.g., from 20° C. to 30° C.). Under room temperature, the adhesion is relatively weak between the support film 42 and the sealing resin 43 due to the mold release process performed on the lower surface of the support film 42. This allows for the support film 42 to be easily removed from the sealing resin 43. Removal of the sealing resin 43 with the support film 42 is prevented or suppressed. This prevents or suppresses the formation of protuberances in the upper surfaces 43A and 43B of the sealing resin 43 and keeps the upper surfaces 43A and 43B of the sealing resin 43 flat. The support film 42 may be removed by naturally or forcibly cooling the thermocompression bonded sealing resin 43 to room temperature. The room temperature is an example of a relatively low first controlled temperature.

Figure 4A:
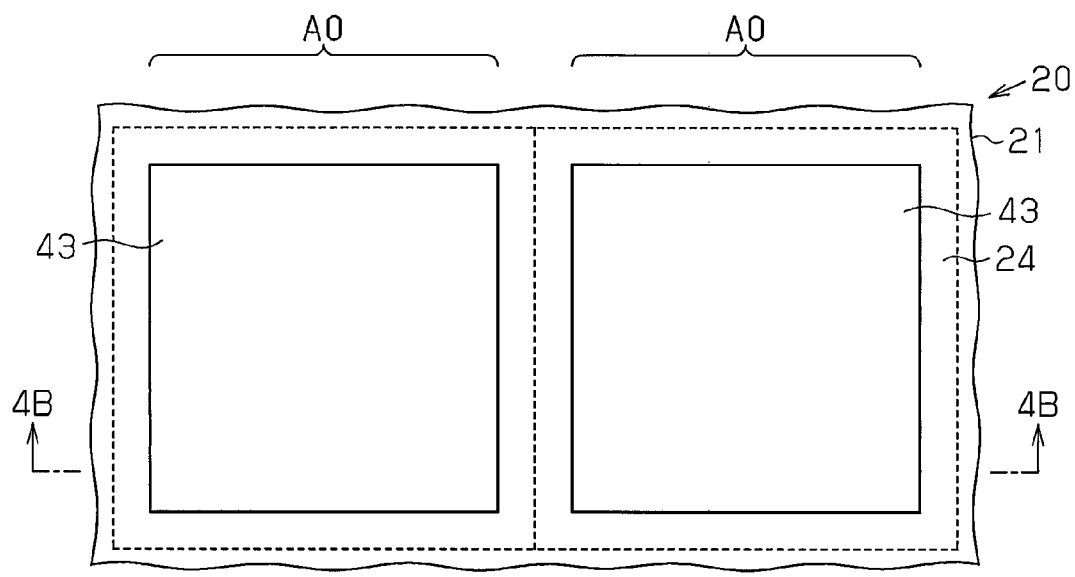
FIG. 4A is a plan view and FIG. 4B is a cross-sectional view illustrating the manufacturing method of the first embodiment.
Figure 4B:
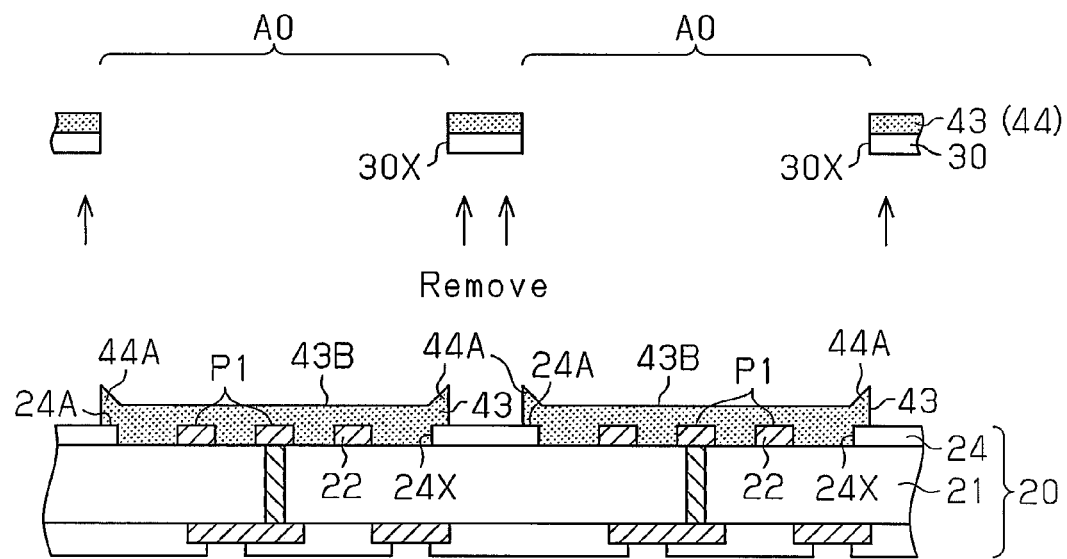

Referring to FIGS. 4A and 4B, the masking tape 30 is removed from the wiring substrate 20 while warming the structural body, from which the support film 42 has been removed, to a relatively high second controlled temperature (e.g., from 100° C. to 120° C.). The heating to the relatively high second controlled temperature softens the sealing resin 43. The softened sealing resin 43 (in particular, a part of the ridge 44) on the masking tape 30 is removed from the wiring substrate 20 with the masking tape 30. When continuously removing the masking tape 30, which is in the form of a lattice, from the entire wiring substrate 20, only the sealing resin 43 (in particular, the portions of the ridges 44) on the masking tape 30 is removed with the masking tape 30. In this manner, the masking tape 30 is removed when the sealing resin 43 is warm and soft. Thus, the softened sealing resin 43 has a smooth torn surface that extends in the thicknesswise direction, and the formation of cracks in the torn surface is prevented or suppressed. As illustrated in FIG. 4B, portions of the ridges 44 remaining on each projection 24A forms a raised rim 44A in each sealing resin 43.

The sealing resin 43 is adhered to the wiring substrate 20 including the wiring pattern 22 when melted. Thus, the sealing resin 43 remains on the wiring substrate 20 when removing the masking tape 30. The sealing resin 43 formed in the opening 30X of the masking tape 30 thus remains on the wiring substrate 20, and the sealing resin 43 remains in each chip mounting region A0 of the wiring substrate 20 with a high positioning accuracy. The sealing resin 43 has a planar shape set in accordance with the planar shape of the opening 30X of the masking tape 30. Each sealing resin 43 covers the upper surface of the substrate main body 21, the wiring pattern 22, and the solder resist layer 24 in each chip mounting region A0.

Figure 5A:
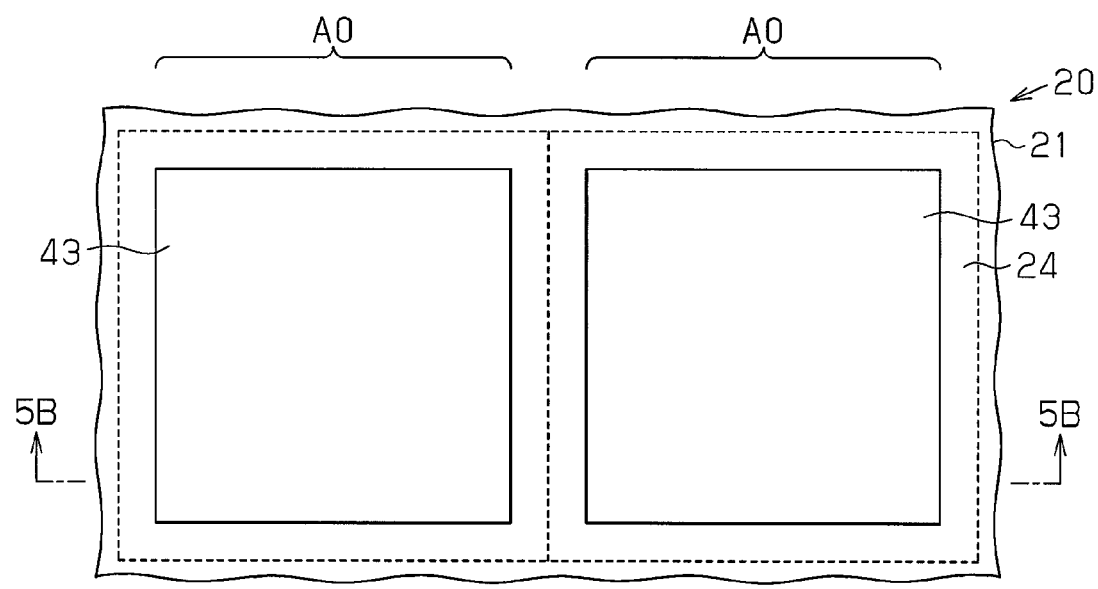
FIG. 5A is a plan view and FIG. 5B is a cross-sectional view illustrating the manufacturing method of the semiconductor device.
Figure 5B:
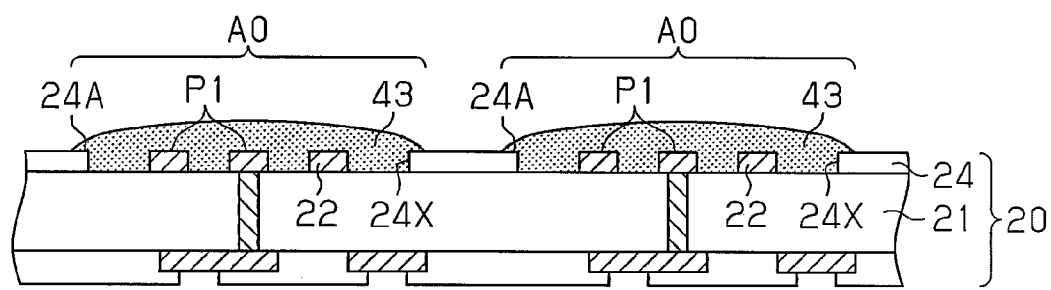

Next, as illustrated in FIG. 5A and FIG. 5B, the raised rim 44A of the sealing resin 43 illustrated in FIG. 4B is removed. For example, the uncured sealing resin 43 is shaped so that the thickness of the rim of the sealing resin 43 after the removal of the raised rim 44A becomes the same as or less than the thickness at an inner portion of the sealing resin 43. In some embodiments, the uncured sealing resin 43 undergoes press molding so that an upward convex surface is formed on the sealing resin 43 at the same time as when removing the raised rim 44A. In the illustrated example, the sealing resin 43 on each chip mounting region A0 has a smooth upward convex surface.

The press molding can be carried out by heating and pressurizing the uncured sealing resin 43 using, for example, a diaphragm (not illustrated) under a vacuum atmosphere. Press molding is performed under conditions in which the vacuum degree in the processing chamber for processing the structural body of FIG. 4B is 100 Pa, the pressure at which the diaphragm presses the sealing resin 43 is 0.7 MPa, and the heating temperature of the uncured sealing resin 43 is 70° C. As described above, the diaphragm may apply the desired pressure to each portion of the sealing resin 43 that comes into contact with the diaphragm by adjusting the pressure, heating temperature and the like, and may shape the sealing resin 43 to the desired form (e.g., upward convex surface).

In another example, the sealing resin 43 is shaped so that the sealing resin 43 has a flat upper surface when removing the raised rim 44A. For example, the upper surface of the sealing resin 43 may be flattened by heating and pressurizing the uncured sealing resin 43 using the diaphragm under a vacuum atmosphere in the same manner as described the above. The processing may be performed under conditions in which, for example, the vacuum degree of the processing chamber is 100 Pa, the pressure at which the diaphragm presses the sealing resin 43 is 0.3 MPa, and the heating temperature of the uncured sealing resin 43 is 100° C.

In this manner, the raised rim 44A of the uncured sealing resin 43 is removed. This prevents or suppresses the formation of bubbles in the sealing resin 43 when flip-chip joining the semiconductor chip 50 to the connection pad 1, as will be described later.

Figure 6A:
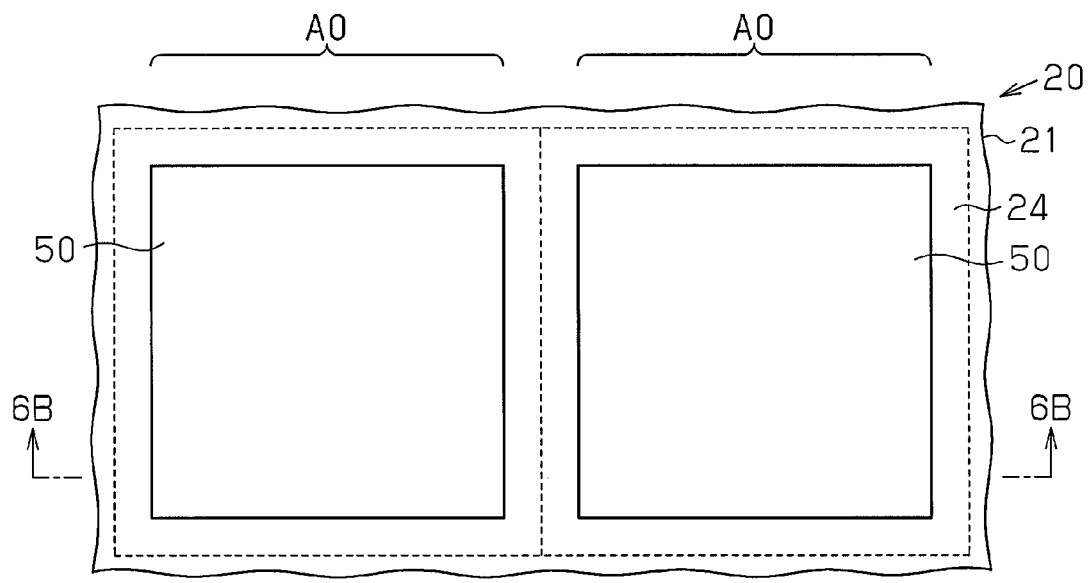
FIG. 6A is a plan view and FIG. 6B is a cross-sectional view illustrating the manufacturing method of the first embodiment.
Figure 6B:
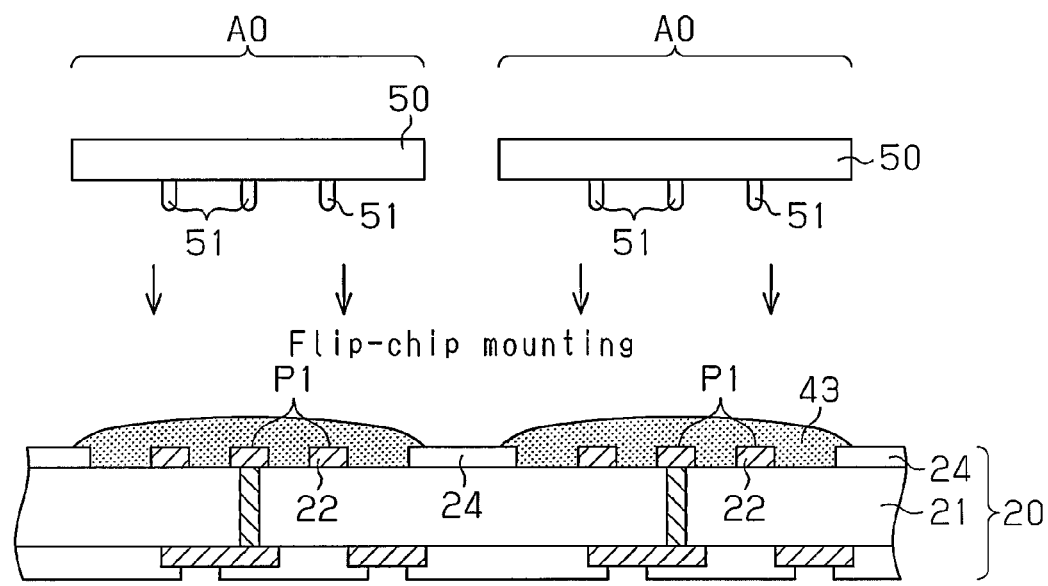

As illustrated in FIGS. 6A and 6B, the semiconductor chip 50 is then prepared. The semiconductor chip 50 includes connection bumps 51 formed on one surface (lower surface herein). An example of the semiconductor chip 50 includes a logic chip such as a central processing unit (CPU) chip and a graphics processing unit (GPU) chip, and a memory chip such as a dynamic random access memory (DRAM) chip, a static random access memory (SRAM) chip, and a flash memory chip. The connection bumps 51 may be, for example, gold bumps or solder bumps. An example of the material of the solder bump includes an alloy containing lead (Pb), an alloy of tin (Sn) and Au, an alloy of Sn and Cu, an alloy of Sn and Ag, and an alloy of Sn, Ag, and Cu.

Figure 7A:
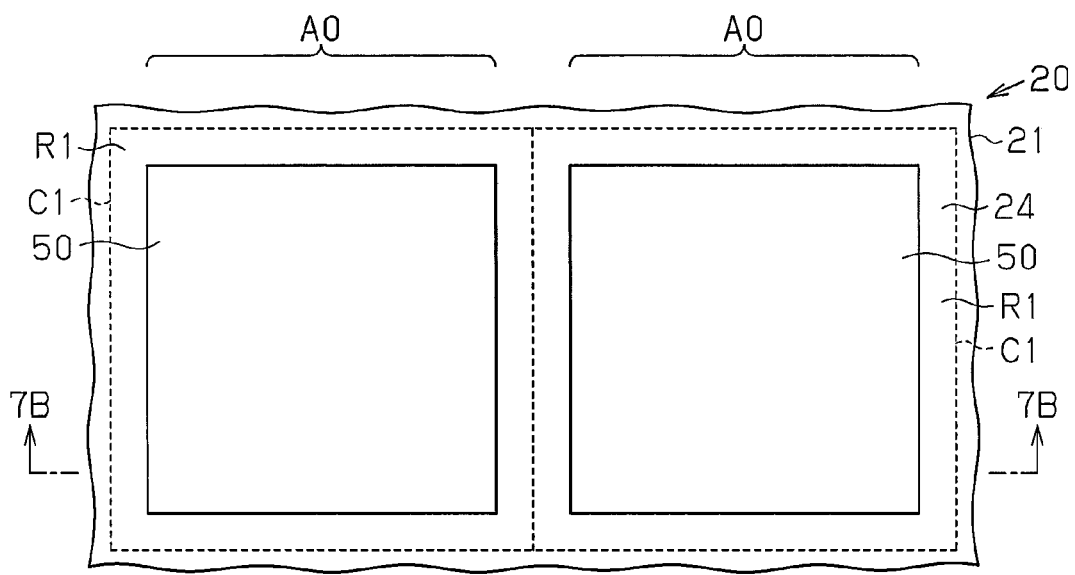
FIG. 7A is a plan view and FIG. 7B is a cross-sectional view illustrating the manufacturing method of the first embodiment.
Figure 7B:
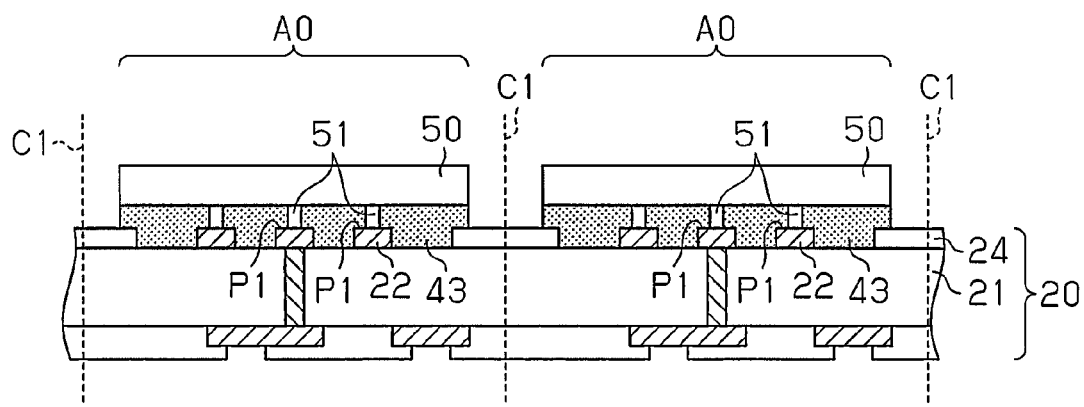

As illustrated in FIGS. 7A and 7B, while heating the wiring substrate 20 so as to soften the sealing resin 43, the semiconductor chip 50 is pressed into the softened sealing resin 43 until the connection bumps 51 of the semiconductor chip 50 come into contact under pressure with the connection pads P1 of the wiring substrate 20. This flip-chip mounts the semiconductor chip 50. In an example in which the connection bumps 51 are formed from solder and/or in an example in which solder is formed on the connection pads P1, the solder is reflow heated at a temperature of approximately 250° C. to connect the connection pads P1 and the connection bumps 51. In the reflow heating, the uncured sealing resin 43 is cured, and the cured sealing resin 43 fills the space between the semiconductor chip 50 and the wiring substrate 20.

Before pressing the semiconductor chip 50, the uncured sealing resin 43 has an upward convex surface. The central part of the upward convex surface of the uncured sealing resin 43 is pressed by the lower surface of the semiconductor chip 50 so that the sealing resin 43 uniformly spreads out toward the outer edge of the semiconductor chip 50. This prevents or suppresses the formation of bubbles in the sealing resin 43. Thus, few, if any, voids remain in the cured sealing resin 43.

In some embodiments in which the reflow heating is insufficient for the curing of the sealing resin 43, the thermosetting process may be performed at a temperature of 170° C. to 190° C. after the reflow heating to completely cure the sealing resin 43. In some embodiments in which the reflow heating is not carried out for the connection of the connection pads P1 and the connection bumps 51, the thermosetting process may be performed at a temperature of 170° C. to 190° C. after connecting the connection pads P1 and the connection bumps 51 to completely cure the sealing resin 43.

After the sealing resin 43 is cured, the structural body illustrated in FIG. 7 is cut along the cutting line C1. This obtains the semiconductor device 60 of the first embodiment as illustrated in FIG. 8.

The first embodiment has the advantages described below.

(1) The manufacturing method of the first embodiment includes removing the support film 42 from the sealing resin 43 at a relatively low first temperature (e.g., room temperature of from 20 to 30° C.), and then removing the masking tape 30 from the wiring substrate 20 while heating the sealing resin 43 to a relatively high temperature. The adhesion between the support film 42 and the sealing resin 43 is weak due to the relatively low first controlled temperature, which is like room temperature, and the mold release process performed on the lower surface of the support film 42. This prevents or suppresses removal of the first resin portions of the sealing resin 43 on the chip mounting region A0 from the support film 42 when removing the support film 42 from the sealing resin 43 under room temperature. Thus, the formation of protuberances in the upper surfaces 43A and 43B of the sealing resin 43 remaining on the wiring substrate 20 is prevented or suppressed, and the upper surfaces 43A and 43B of the sealing resin 43 are kept flat. Further, since the masking tape 30 is removed when the sealing resin 43 is heated and softened, the sealing resin 43 (second resin portion) on the masking tape 30 is torn from the sealing resin 43 (first resin portion) on the chip mounting regions A0, and the sealing resin 43 (first resin portion) on the chip mounting regions A0 has a smooth torn surface that extends in the thicknesswise direction. This prevents or suppresses the formation of cracks in the torn surface of the sealing resin 43 remaining in the chip mounting regions A0. Thus, damages to the sealing resin 43 (first resin portion) on the chip mounting region A0 are prevented or suppressed.

(2) The manufacturing method of the first embodiment includes forming the upward convex surface or the flat surface in the sealing resin 43 when eliminating the raised rim 44A of the sealing resin 43 in each chip mounting region A0, and then flip-chip mounting the semiconductor chip 50 onto the sealing resin 43. The removal of the raised rim 44A of the uncured sealing resin 43 prevents or suppresses the formation of bubbles in the sealing resin 43 when pressing the semiconductor chip 50 into the sealing resin 43 to flip-chip mount the semiconductor chip 50.

(3) The flip-chip mounting of the semiconductor chip 50 includes pressing the semiconductor chip 50 against the upward convex surface of the uncured sealing resin 43. When the central part of the upward convex surface of the uncured sealing resin 43 is pressed by the lower surface of the semiconductor chip 50, the uncured sealing resin 43 uniformly spreads out toward the edge of the semiconductor chip 50. This prevents or suppresses the formation of bubbles in the sealing resin 43. Thus, few, if any, voids remain in the cured sealing resin 43.

(4) The manufacturing method of the first embodiment includes roughening the upper surface of the substrate main body 21 and the upper surface of the solder resist layer 24, and forming the sealing resin 43 on the roughened upper surfaces of the substrate main body 21 and the solder resist layer 24. The roughening improves the wetness of the sealing resin 43 with respect to the substrate main body 21 and the solder resist layer 24. This prevents or suppresses the formation of bubbles in the sealing resin 43 when thermocompressing and bonding the sealing resin 43 with the wiring substrate 20. Thus, few, if any, voids remain in the cured sealing resin 43.

A second embodiment will now be described with reference to FIGS. 9 to 11 focusing on differences from the first embodiment.

Figure 9A:
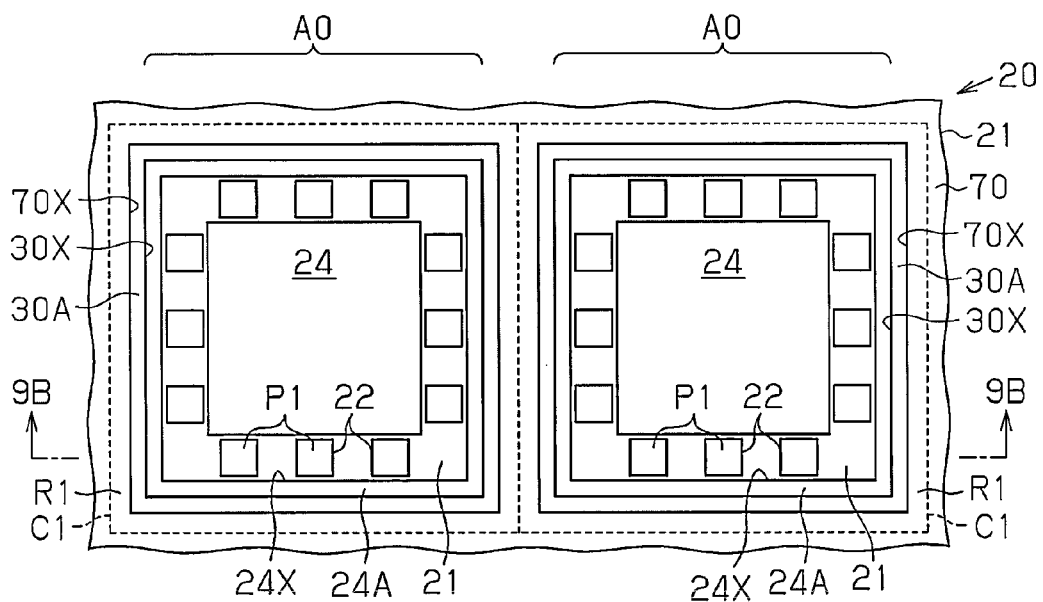
FIG. 9A is a plan view and FIG. 9B is a cross-sectional view illustrating a method of manufacturing a semiconductor device of a second embodiment.
Figure 9B:
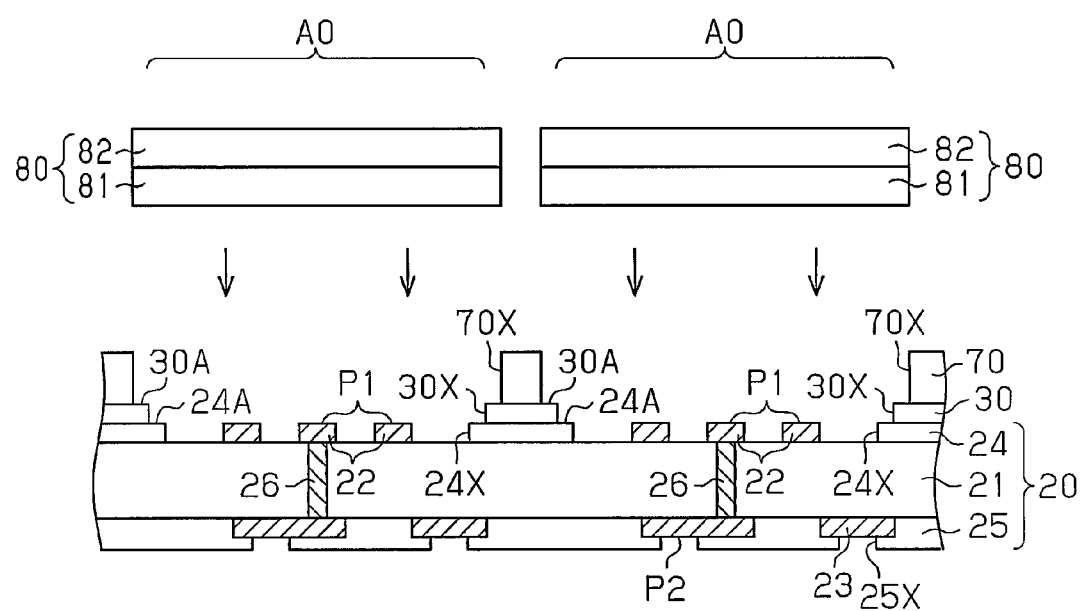

Referring to FIGS. 9A and 9B, in the same manner as FIGS. 1 and 2, the masking tape 30 is applied to the solder resist layer 24 of the wiring substrate 20. Then a transfer jig 70 is tentatively adhered with an adhesive to the masking tape 30. A mold release agent such as Teflon (registered trademark) is applied to the outer surface of the transfer jig 70 so that the transfer jig 70 can easily be removed from the masking tape 30.

The transfer jig 70 includes openings 70X that are larger than the openings 30X at positions corresponding to the openings 30X of the masking tape 30. Thus, in each region R1, a portion of the masking tape 30 projects into the corresponding opening 70X of the transfer jig 70 and forms a projection 30A, or step, extending along the periphery of the region R1.

As illustrated in FIG. 9B, sealing resin materials 80 are prepared cut into a size substantially corresponding to each chip mounting region A0. In the present embodiment, the size of each sealing resin material 80 is set to be greater by a certain extent than the area of the corresponding opening 30X in the masking tape 30, and the rim of the sealing resin material 80 is arranged on the projection 30A. In the same manner as the sealing resin material 40, each sealing resin material 80 includes a resin film 81, and a support film 82 is formed on the resin film 81.

Figure 10A:
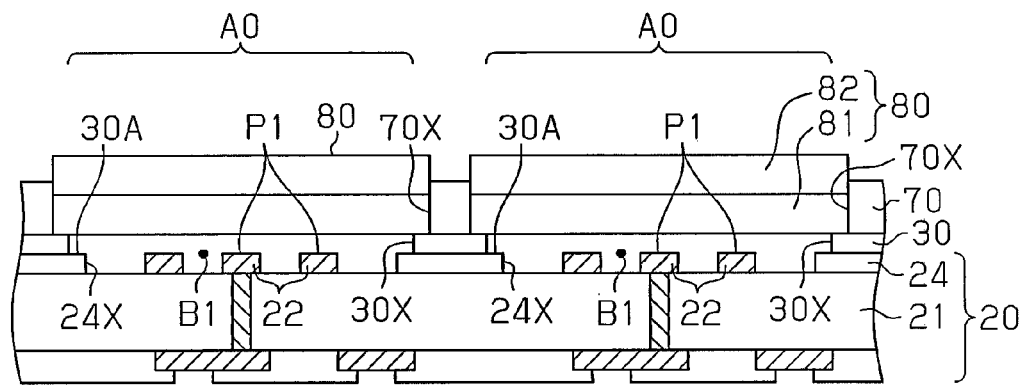
FIGS. 10A to 10C are cross-sectional views for illustrating the manufacturing method of the second embodiment.

As illustrated in FIGS. 9 and 10A, a large number of sealing resin materials 80 are arranged on the transfer jig 70, and the wiring substrate 20 is vibrated so that the sealing resin materials 80 enter the openings 70X of the transfer jig 70. In this case, the sealing resin materials 80 are arranged on the projections 30A of the masking tape 30, as illustrated in FIG. 10A. A cavity B1 is defined at the lower side of the sealing resin material 80 by the sealing resin material 80, the masking tape 30, the solder resist layer 24, and the substrate main body 21. The plan view of FIG. 9A does not illustrate the sealing resin material 80.

Figure 10B:
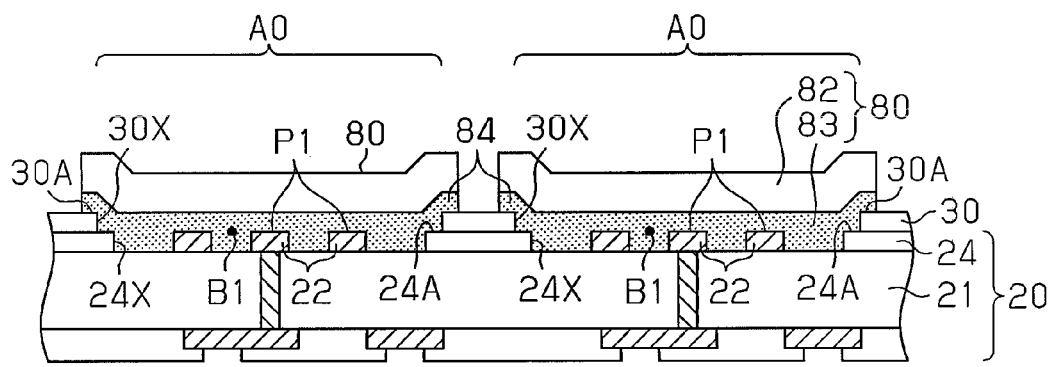

Next, as illustrated in FIG. 10B, each resin film 81 is thermocompressed and bonded to the wiring substrate 20, and each resin film 81 is applied to the wiring substrate 20 like in FIG. 3B. This fills the melted resin film 81 in the cavity B1, and the sealing resin 83 is applied to the wiring substrate 20 at the same time as when the uncured sealing resin 83 is formed in the cavity B1, as illustrated in FIG. 10B. The sealing resin 83 extends from the chip mounting region A0 to the upper surface of the projection 30A of the masking tape 30, and covers the upper surface of the substrate main body 21, the upper surface and the side surface of the wiring pattern 22, and the side surface and the upper surface of the projections 24A, 30A. Portions of the sealing resin 83 form ridges 84 that cover the solder resist layer 24 and the masking tape 30.

Figure 10C:
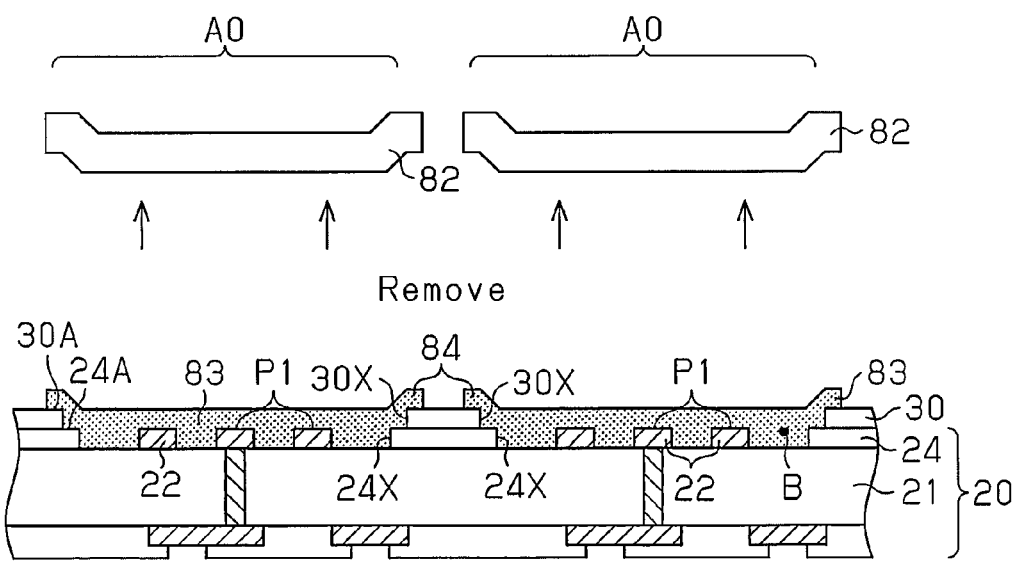

As illustrated in FIG. 10C, the support film 82 is removed from the sealing resin 83 under room temperature (e.g., from 20 to 30° C.). This allows for removal of only the support film 82 from the sealing resin 83. This prevents or suppresses removal of portions of the sealing resin 83 from the support film 82. Then, the transfer jig 70 is removed from the wiring substrate 20 to expose the upper surface of the masking tape 30.

Figure 11A:
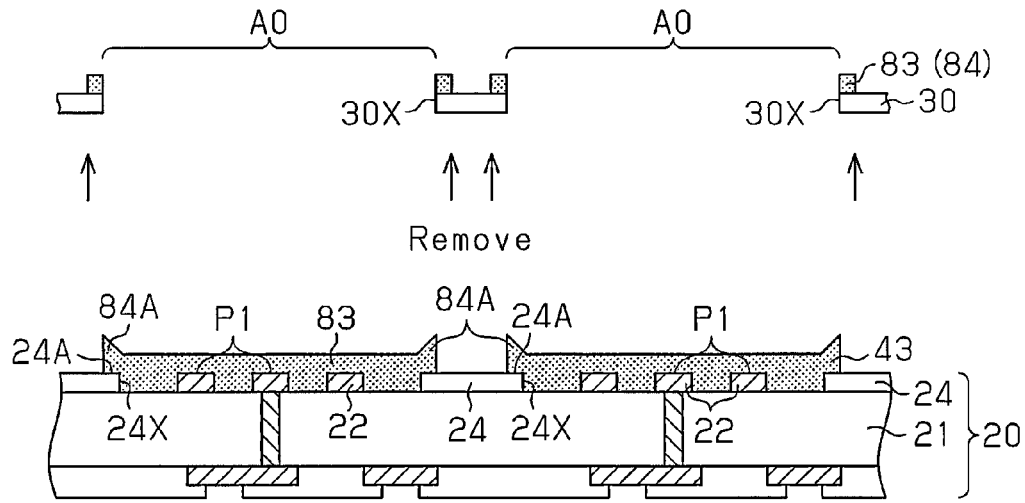
FIGS. 11A to 11C are cross-sectional views illustrating the manufacturing method of the second embodiment.

Then, as illustrated in FIG. 11A, while heating the structural body from which the support film 82 has been removed from 100° C. to 120° C., the masking tape 30 is removed from the wiring substrate 20. The softened sealing resin 83 (in particular, portions of each ridge 84) on the masking tape 30 is removed from the wiring substrate 20 with the masking tape 30. When continuously removing the masking tape 30, which is in the form of a lattice and extends over the entire wiring substrate 20, only the sealing resin 83 (in particular, a part of the ridge 84) on the masking tape 30 is removed with the masking tape 30. Portions of the ridge 84 remaining on each projection 24A form a raised rim 84A on each sealing resin 83.

Figure 11B:
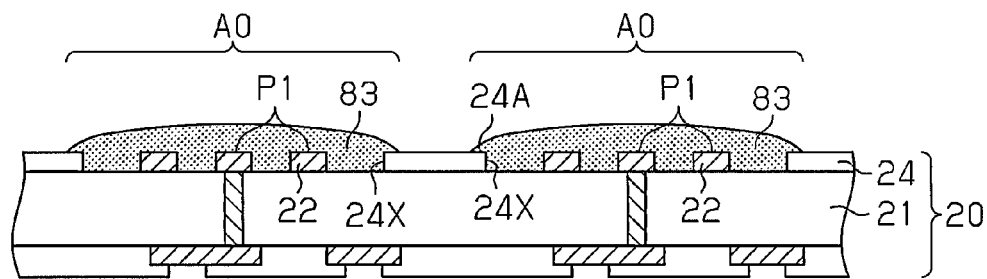

As illustrated in FIG. 11B, the uncured sealing resin 83 is reshaped so that the thickness of the rim of the sealing resin 83 becomes the same as or less than the thickness at the inner portion of the sealing resin 83 like in FIG. 5. For example, by press molding the sealing resin 83, the upward convex surface is formed in the sealing resin 83 at the same time as when the raised rim 84A is removed. The obtained structural body has a structure similar to the structural body illustrated in FIG. 5.

Figure 11C:
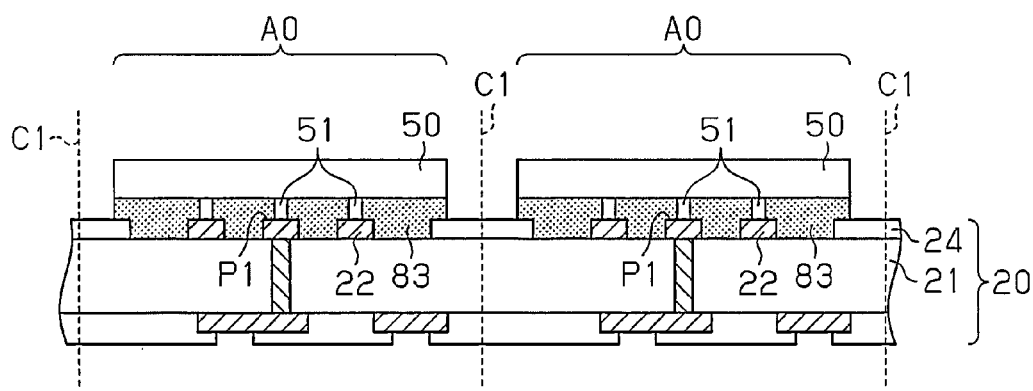

Then, as illustrated in FIG. 11C, the connection bumps 51 of the semiconductor chip 50 are pressed into the sealing resin 83, the connection bumps 51 are flip-chip joined with the connection pads P1 of the wiring substrate 20, and the sealing resin 83 is cured, in the same manner as FIGS. 6 and 7. Subsequently, the structural body illustrated in FIG. 11C is cut along the cutting line C1 to obtain the semiconductor device of the second embodiment.

The second embodiment has the same advantages as the first embodiment.

It should be apparent to those skilled in the art that the present disclosure may be embodied in many other specific forms without departing from the spirit or scope of the invention. Particularly, it should be understood that the present disclosure may be embodied in the following forms.

In each of the above embodiments, the openings 30X that have a shape similar to the planar shape (tetragonal) of the semiconductor chip 50 are formed in the masking tape 30 at portions corresponding to the chip mounting region A0. However, the planar shape of openings in the masking tape 30 is not limited in such a manner.

Figure 12A:
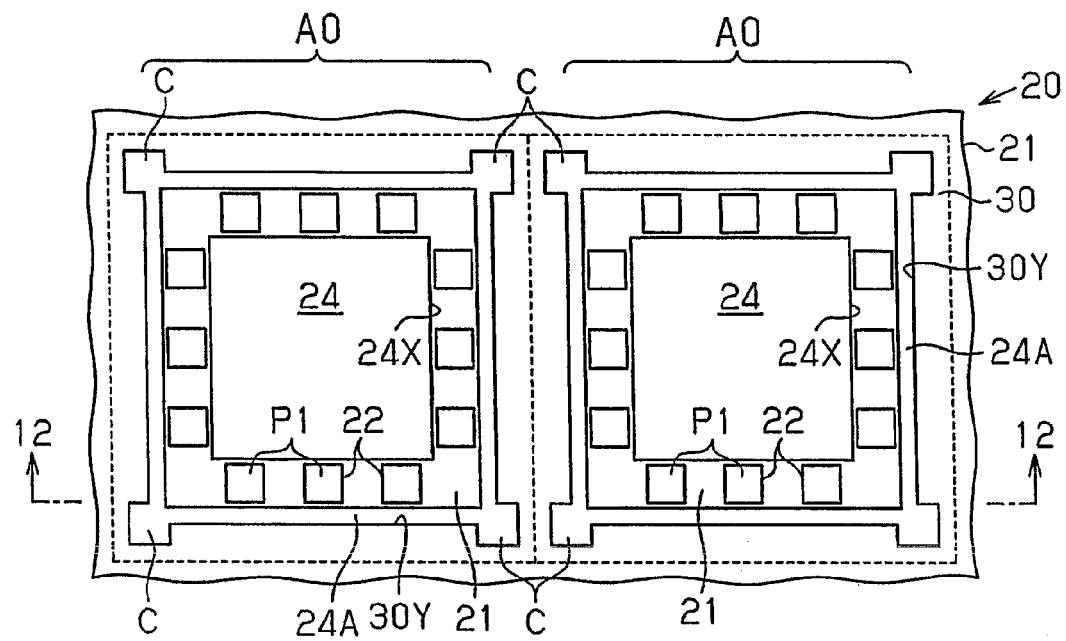
FIGS. 12A, 12B, 13A, 13B, 14A, and 14B are schematic diagrams illustrating another example of a manufacturing method.

For example, as shown in FIG. 12A, an opening 30Y formed in the masking tape 30 may be tetragonal as viewed from above and be locally widened at the four corners C of the tetragon. Each locally widened corner C extends outward from the corresponding sides of the tetragon. In the example shown in FIG. 12A, each corner C is tetragonal as viewed from above. A method of manufacturing the semiconductor device 60 when changing the opening 30X to the opening 30Y will now be described.

Figure 12B:
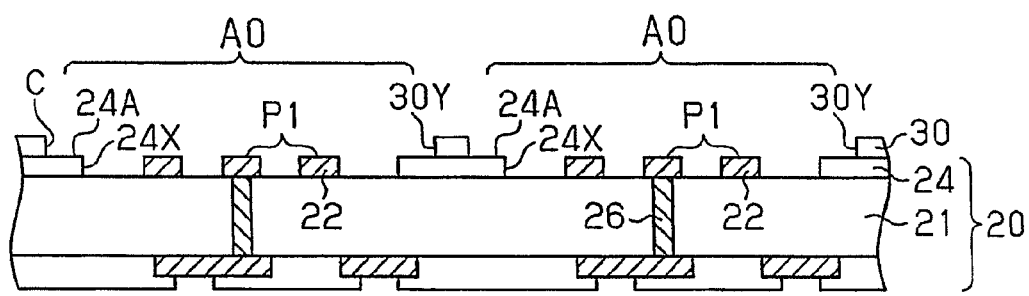

First, as shown in FIGS. 12A and 12B, a masking tape 30 including the openings 30Y is adhered to the solder resist layer 24. This partially exposes the solder resist layer 24 from the corners C.

Figure 13A:
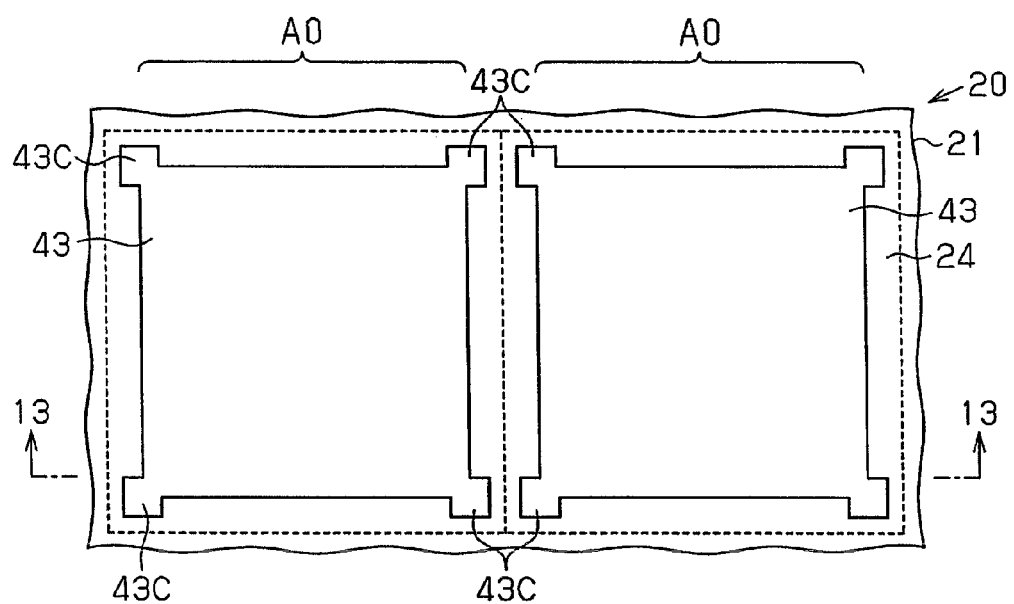
Figure 13B:
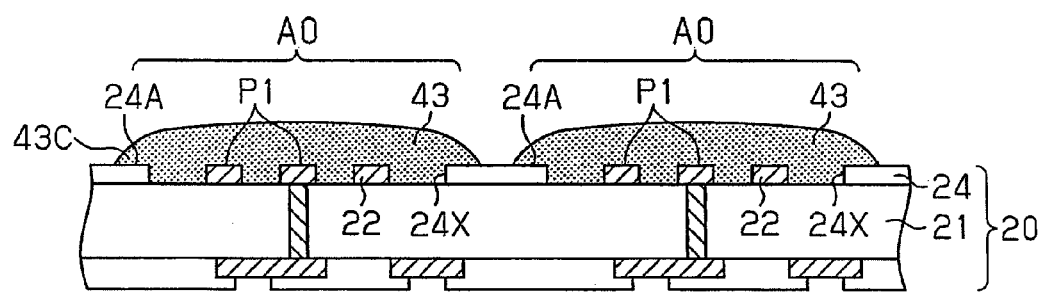

Then, the steps illustrated in FIGS. 3 to 5 (or FIGS. 9 to 11B) are performed to obtain the structure shown in FIGS. 13A and 13B. More specifically, referring to FIG. 13B, the uncured sealing resin 43 is formed on the substrate main body 21. The uncured sealing resin 43 covers the upper surface of the substrate main body 21, the wiring pattern 22, and parts of the upper surface of the solder resist layer 24. The planar shape of the sealing resin 43 is set by the planar shape of the opening 30Y in the masking tape 30. More specifically, the planar shape of the sealing resin 43 is similar to the planar shape of the opening 30Y. Thus, referring to FIG. 13A, the sealing resin 43 is formed to be tetragonal as a whole when viewed from above, and the four corners 43C of the tetragon are locally spread. Each corner 43C of the present example is tetragonal as viewed from above.

Figure 14A:
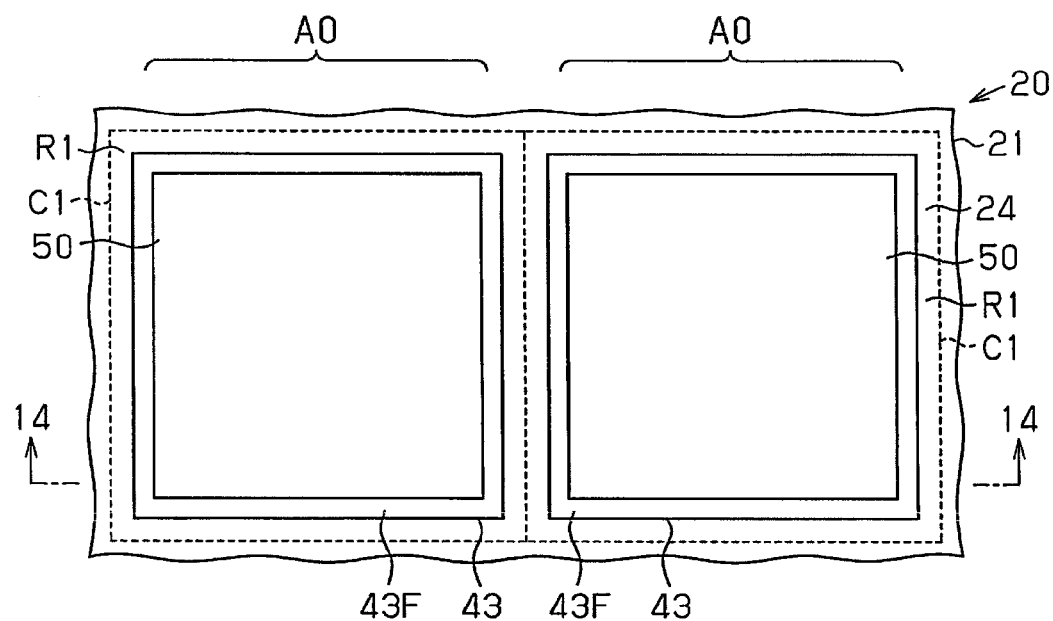
Figure 14B:
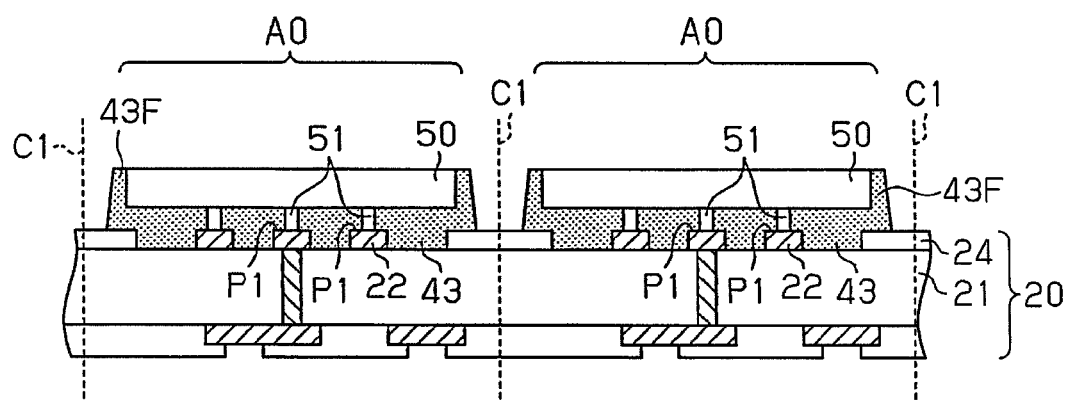

Then, in the step illustrated in FIGS. 14A and 14B, in the same manner as the steps of FIGS. 6 and 7, the semiconductor chip 50 is pressed into each sealing resin 43, the connection bumps 51 of the semiconductor chip 50 are flip-chip joined with the connection pads P1 of the wiring substrate 20, and the sealing resin 43 is cured. In this case, when the semiconductor chip 50 is pressed into the sealing resin 43, the uncured sealing resin 43 is pressed by the lower surface of the semiconductor chip 50 and spread in the planar direction. Portions of the sealing resin 43 spread in the planar direction are extended to the side surfaces of the semiconductor chip 50 to form a fillet 43F in the peripheral portion of the sealing resin 43. As shown in FIG. 14B, the semiconductor chip 50 of the present example is embedded in the sealing resin 43 so that the sealing resin 43 covers the lower surface and side surfaces of the semiconductor chip 50. The fillet 43F of the present example is formed to cover all of the side surfaces of the semiconductor chip 50. Further, the upper surface of the fillet 43F is formed to be flush with the upper surface of the semiconductor chip 50. In this manner, as shown in FIG. 14A, the fillet 43F is formed to cover the entire periphery of the semiconductor chip 50 including the side surfaces at the four corners.

When a semiconductor chip is pressed into an uncured sealing resin and a fillet extends along the side surfaces of the semiconductor chip, the amount of resin at the four corners of the semiconductor chip has a tendency of becoming insufficient. However, in the present example, the corners 43C are formed at portions corresponding to the four corners of the semiconductor chip 50. The corners 34C locally spread the region in which the sealing resin 43 is formed. That is, the corners 34C locally increase the amount of resin and allows for the fillet 43F to be formed in a desirable manner at the four corners of the semiconductor chip 50.

When entirely increasing the resin amount of the sealing resin 43, the fillet 43F formed at the middle of each side of the semiconductor chip 50 projects further outward than other portions of the fillet 43F. However, in the present example, the sealing resin 43 is spread at the four corners 43C. This suppresses the outward projection of the fillet 43F at the middle of each side of semiconductor chip 50 in a desirable manner. Thus, the sealing resin 43, which includes the fillet 43F, has a shape as viewed from above that is further closer to a tetragon. Adjustment of the planar shape of the sealing resin 43 before mounting the semiconductor chip 50 allows for adjustment of the spread shape of the sealing resin 43 after mounting the semiconductor chip 50. In other words, adjustment of the shape of the opening 30Y in the masking tape 30 that sets the planar shape of the sealing resin 43 before mounting the semiconductor chip 50 allows for adjustment of the spread shape of the sealing resin 43 after mounting the semiconductor chip 50.

In the modified example shown in FIGS. 12 to 14, the planar shape of the sealing resin 43 before mounting the semiconductor chip 50 is not particularly limited as long as the resin amount may be locally increased at the four corners of the sealing resin.

Figure 15:
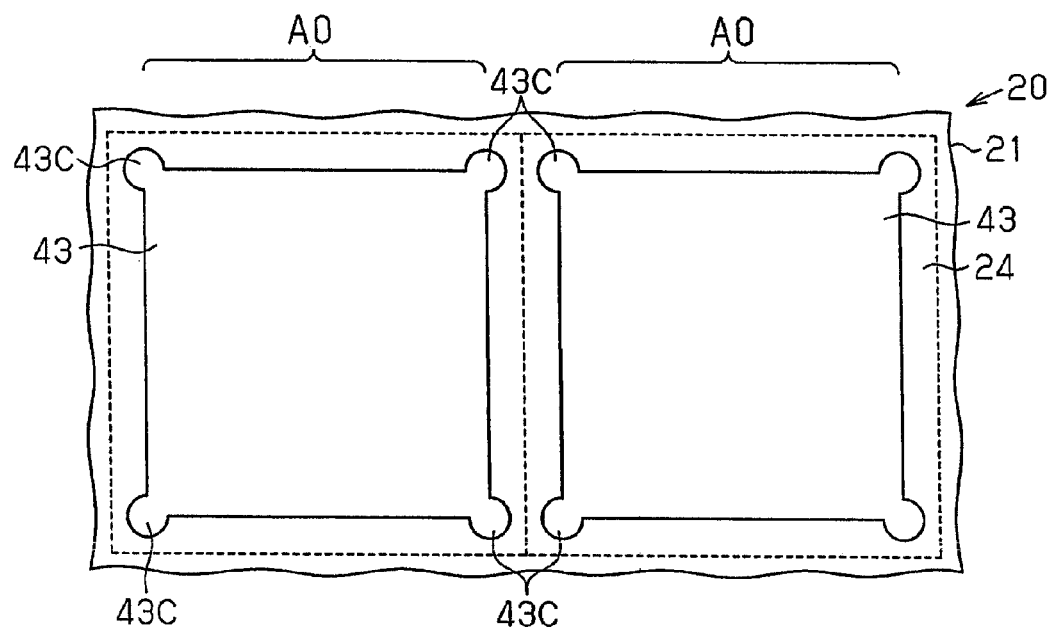
FIGS. 15 and 16 are schematic diagrams illustrating further examples of a manufacturing method.

For example, as shown in FIG. 15, the planar shape of the corners 43C of the sealing resin 43 may be changed to be circular. The planar shapes of the corners 43C of the sealing resin 43 may also be changed to be polygonal, for example, triangular or pentagonal.

Figure 16:
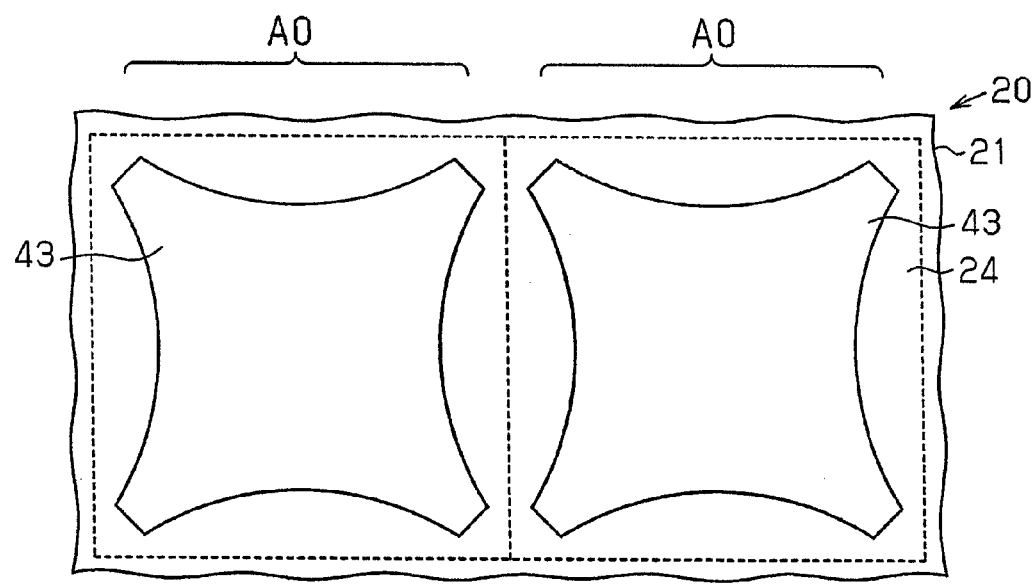
Figure 17A:
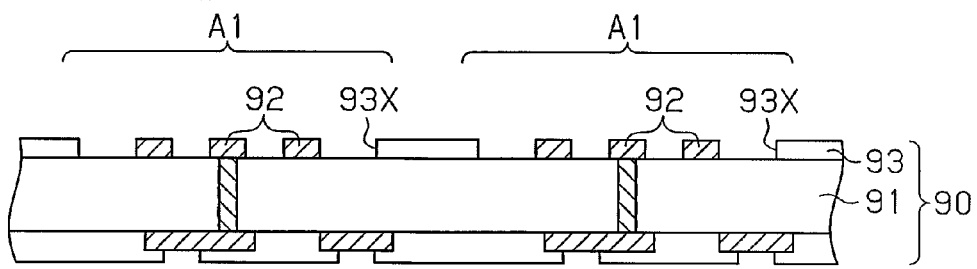
FIGS. 17A to 17D are cross-sectional views illustrating a method of manufacturing a semiconductor device in a referential example.
Figure 17B:
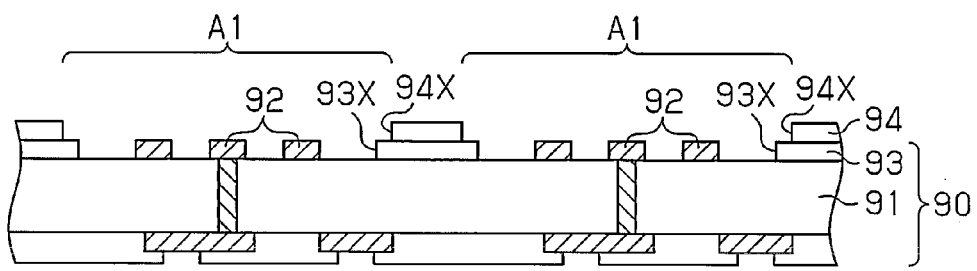
Figure 17C:
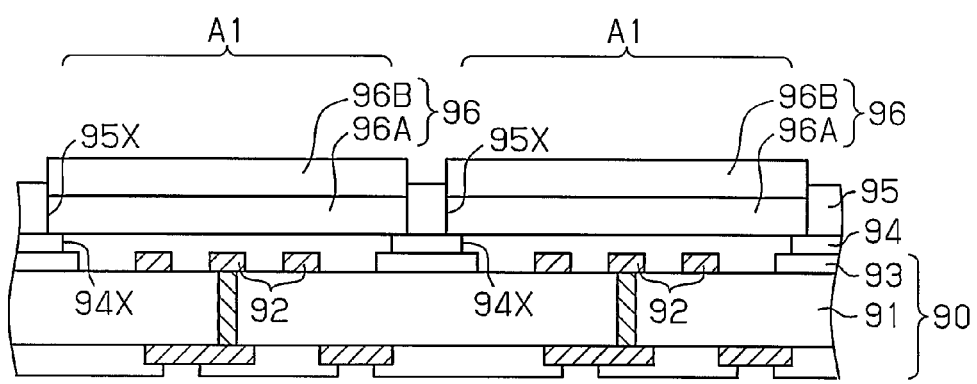
Figure 17D:
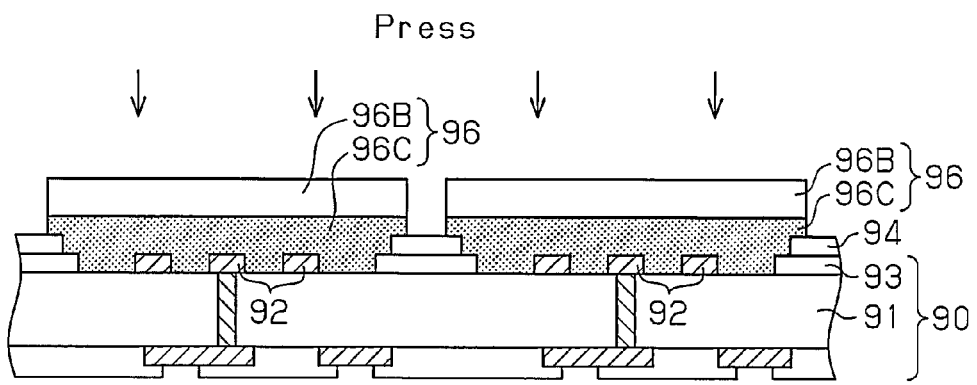
Figure 18A:
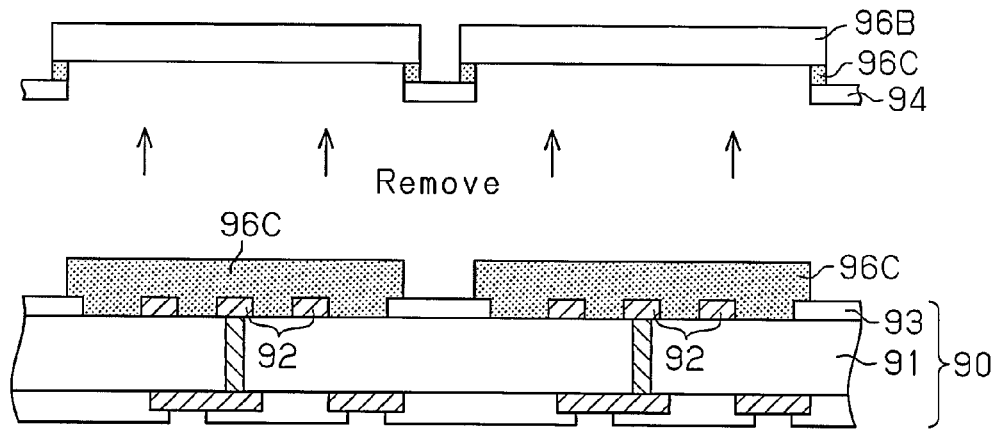
FIGS. 18A to 18C are cross-sectional views illustrating the manufacturing method of the referential example.
Figure 18B:
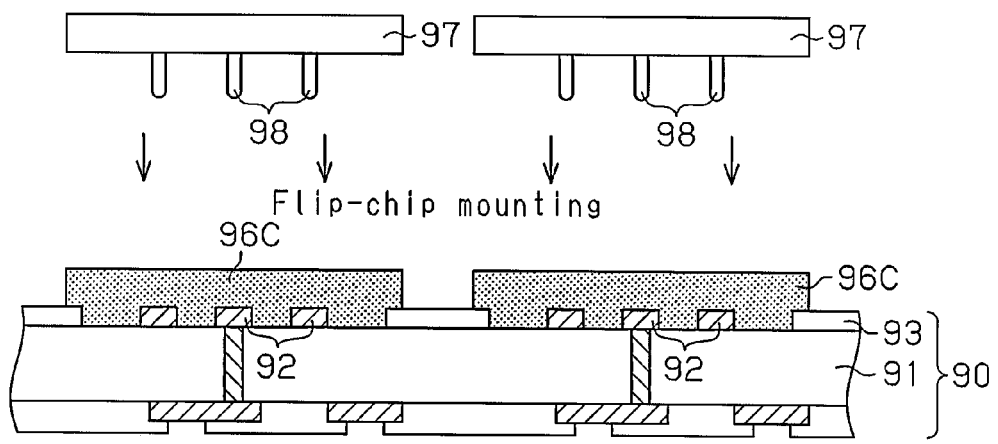
Figure 18C:
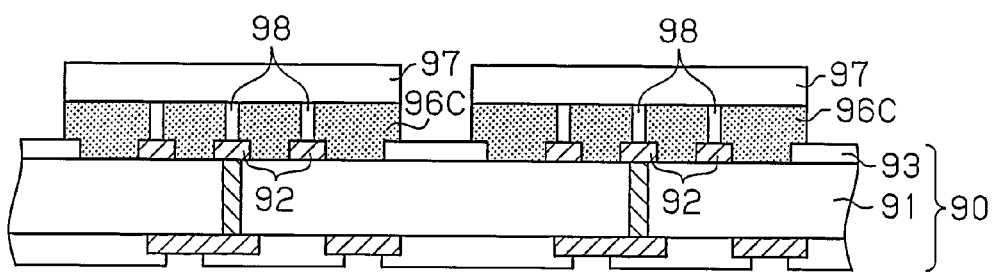

As shown in FIG. 16, each side of the sealing resin 43, which is tetragonal when viewed from above, may be recessed.

The roughening of the upper surface of the substrate main body 21 may be omitted.

The step of shaping the sealing resin 43, 83 to eliminate the raised rim 44A, 84A of the sealing resin 43, 83 may be omitted.

The step of shaping the sealing resin 43, 83 to eliminate the raised rim 44A, 84A of the sealing resin 43, 83 is not limited to press molding, and for example, the raised rim 44A, 84A of the sealing resin 43, 83 may be at least partially removed in an etching process.

In the second embodiment, a mask jig may be tentatively adhered to the wiring substrate 20 with an adhesive or the like instead of the masking tape 30. For example, the mask jig is coated with the mold release agent such as Teflon (registered trademark) and the like at the outer surface, and can thus be easily removed from the wiring substrate 20. When using a mask jig, the mask jig may also function as the transfer jig 70, and the transfer jig 70 may be omitted.

The masking member is not limited to the masking tape 30, and various types of masking members that can be easily tentatively adhered to and removed from the solder resist layer 24 (wiring substrate 20) may be used.

A method of manufacturing a plurality of semiconductor devices 60 from one wiring substrate 20 has been described. Instead, a single semiconductor device 60 may be manufactured from a single wiring substrate 20.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A method of manufacturing a semiconductor device, the method comprising:
   forming a masking member including an opening on a wiring substrate including a chip mounting region so as to align the opening with the chip mounting region;
   forming an uncured sealing resin on at least the chip mounting region of the wiring substrate, wherein a support film is formed on the uncured sealing resin;
   removing the support film from the uncured sealing resin;
   removing the masking member from the wiring substrate so that the uncured sealing resin remains on the chip mounting region; and
   flip-chip mounting a semiconductor chip onto the chip mounting region with the uncured sealing resin arranged in between,
   wherein the uncured sealing resin has a higher temperature when removing the masking member than when removing the support film.

2. The method according to claim 1, wherein
   the removing the support film from the uncured sealing resin is performed under room temperature; and
   the removing the masking member from the wiring substrate is performed while heating the wiring substrate.

3. The method according to claim 1, further comprising shaping the uncured sealing resin on the chip mounting region after removing the masking member, wherein the shaping the uncured sealing resin includes forming a rim of the uncured sealing resin with a thickness that is less than or the same as that of an inner portion of the uncured sealing resin.

4. The method according to claim 3, wherein the shaping the uncured sealing resin includes press molding the uncured sealing resin so that the uncured sealing resin has an upward convex surface.

5. The method according to claim 3, wherein the shaping the uncured sealing resin includes heating and pressurizing the uncured sealing resin with a diaphragm under a vacuum atmosphere.

6. The method according to claim 1, further comprising roughening a surface of the wiring substrate at least where the uncured sealing resin is applied to, wherein the roughening is performed before the masking member is formed.

7. The method according to claim 1, wherein
   the uncured sealing resin includes a first resin portion, which covers the chip mounting region, and a second resin portion, which covers the masking member; and
   the removing the masking member from the wiring substrate includes tearing the second resin portion covering the masking member from the first resin portion covering the chip mounting region, and removing the second resin portion together with the masking member.

8. The method according to claim 1, wherein the flip-chip mounting a semiconductor chip includes
   pressing the semiconductor chip into the uncured sealing resin on the chip mounting region until a connection bump of the semiconductor chip is connected to the wiring substrate to fill a lower side of the semiconductor chip with the uncured sealing resin, and
   curing the uncured sealing resin by thermally processing the uncured sealing resin at the lower side of the semiconductor chip.

9. The method according to claim 1, wherein
   the wiring substrate includes a plurality of chip mounting regions;
   the forming the uncured sealing resin and the support film includes
     preparing a sealing resin material onto which the support film and a resin film functioning as the uncured sealing resin are laminated, and
     thermocompressing and bonding the resin film to the wiring substrate with the support film arranged at an upper side of the chip mounting regions to form the uncured sealing resin including a first resin portion, which covers the chip mounting regions, and a second resin portion, which covers the masking member; and
   the removing the masking member from the wiring substrate includes tearing and removing the second resin portion, which covers the masking member, from the first resin portion, which covers the chip mounting regions.

10. A method of manufacturing a semiconductor device, the method comprising:
    forming a masking member on a wiring substrate, wherein the wiring substrate includes a chip mounting region exposed from the masking member;
    thermocompressing and bonding an uncured sealing resin to the masking member and the chip mounting region with the uncured sealing resin supported by a support film;
    cooling the uncured sealing resin to a first controlled temperature with a first resin portion and a second resin portion of the uncured sealing resin respectively covering the chip mounting region and the masking member;
    removing the support film from the uncured sealing resin at the first controlled temperature;
    heating the uncured sealing resin to a second controlled temperature, which is higher than the first controlled temperature, after removing the support film;
    removing the masking member from the wiring substrate together with the second resin portion of the uncured sealing resin at the second controlled temperature;
    flip-chip mounting a semiconductor chip onto the chip mounting region with the first resin portion of the uncured sealing resin arranged in between; and
    curing the first resin portion of the uncured sealing resin between the chip mounting region and the semiconductor chip.

* * * * *